United States Patent
Verspecht

(10) Patent No.: US 7,038,468 B2
(45) Date of Patent: May 2, 2006

(54) METHOD AND A TEST SETUP FOR MEASURING LARGE-SIGNAL S-PARAMETERS THAT INCLUDE THE COEFFICIENTS RELATING TO THE CONJUGATE OF THE INCIDENT WAVES

(76) Inventor: Jan Verspecht, Gertrudeveld 15, Londerzeel (BE) 1840

( * ) Notice: Subject to any disclaimer, the term of this patent is extended or adjusted under 35 U.S.C. 154(b) by 0 days.

(21) Appl. No.: 10/856,841

(22) Filed: Jun. 1, 2004

(65) Prior Publication Data

US 2004/0257092 A1 Dec. 23, 2004

Related U.S. Application Data

(60) Provisional application No. 60/477,349, filed on Jun. 11, 2003.

(51) Int. Cl.
*G01R 27/04* (2006.01)
*G01R 23/00* (2006.01)
(52) U.S. Cl. .................................. 324/638; 324/76.19
(58) Field of Classification Search ................ 324/638, 324/637, 629, 600, 612, 613, 615, 623, 76.19, 324/646, 76.21, 650, 601; 702/57, 66, 69, 702/75–77, 117, 121; 73/12.01, 579
See application file for complete search history.

(56) References Cited

U.S. PATENT DOCUMENTS

| | | | |
|---|---|---|---|
| 4,816,767 A * | 3/1989 | Cannon et al. | 324/601 |
| 5,036,479 A * | 7/1991 | Prednis et al. | 702/121 |
| 5,336,988 A * | 8/1994 | Chmielewski et al. | 324/76.19 |
| 5,588,142 A | 12/1996 | Sharrit | |
| 6,066,953 A * | 5/2000 | Wadell | 324/601 |
| 6,292,000 B1 * | 9/2001 | Kapetanic et al. | 324/623 |
| 6,300,775 B1 * | 10/2001 | Peach et al. | 324/601 |
| 6,348,804 B1 | 2/2002 | Evers | |
| 6,529,844 B1 * | 3/2003 | Kapetanic et al. | 702/85 |
| 6,594,604 B1 * | 7/2003 | Metzger et al. | 702/104 |
| 6,766,262 B1 * | 7/2004 | Martens | 702/69 |
| 2002/0196033 A1 | 12/2002 | Martens | |

(Continued)

FOREIGN PATENT DOCUMENTS

EP    1 296 149 A1    3/2003

OTHER PUBLICATIONS

Jan Verspecht, Marc Vanden Bossche and Frans Verbeyst, "Characterizing Components Under Large Signal Excitation: Defining Sensible 'Large Signal S-Parameters'?!," 49th ARFTG Conference Digest, pp. 109-117, Jun. 1997.

(Continued)

*Primary Examiner*—Anjan Deb
*Assistant Examiner*—Hoai-An D. Nguyen

(57) ABSTRACT

The values of the 6 complex parameters of a large-signal S-parameter model of a high frequency device-under-test are determined by using a frequency-offset probe-tone method. A relatively large one tone signal is applied to the input port of the device and a relatively small one tone signal having a frequency offset relative to the frequency of this large one tone signal is applied to the output port of the device. The 6 large-signal S-parameters are found by measuring and processing the spectral components of the incident and the scattered voltage waves at the device signal ports. These spectral components appear at 3 frequencies: at the frequency of the large one tone signal, at the frequency of the small one tone signal and at the frequency of the large one tone signal minus the frequency offset of the small one tone signal.

3 Claims, 4 Drawing Sheets

U.S. PATENT DOCUMENTS

2003/0027197 A1* 2/2003 Nikitin et al. .................. 435/6

OTHER PUBLICATIONS

William H. Leighton, Roger J. Chaffin and John G. Webb, "RF Amplifer Design with Large-Signal S-parameters," IEEE Transactions on Microwave Theory and Techniques, vol. MTT-21, No. 12, Dec. 1973.

D. Schreurs, J. Verspecht, B. Nauwelaers, A. Van De Capelle and M. Van Rossum, "Direct Extraction of the Non-Linear Model for Two-Port Devices from Vectorial Non-Linear Network Analyzer Measurements," 27th European Microwave Conference, vol. 2, Sep. 8-12, 1997, pp. 921-926.

J. Verspecht,"Eveything you 've always wanted to know about Hot-S22 (but were afraid to ask)," notes and slides of the workshop "Introducing New Concepts in Nonlinear Network Design" at the International Microwave Symposium 2002, Seattle, Washington, USA.

E. Ngoya, N. Le Gallou, J.M. Nebus, H. Buret and P. Reig, "Accurate RF and Microwave System Level Modeling of Wide Band Nonlinear Circuits, " 2000 IEEE MTT-S Conference Digest, pp. 79-82, Boston, Massachusetts, USA.

* cited by examiner

METHOD AND A TEST SETUP FOR MEASURING LARGE-SIGNAL S-PARAMETERS THAT INCLUDE THE COEFFICIENTS RELATING TO THE CONJUGATE OF THE INCIDENT WAVES

CROSS-REFERENCE TO RELATED APPLICATIONS

This application is entitled to the benefit of Provisional application Ser. No. 60/477,349, filed on Jun. 11, 2003.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

SEQUENCE LISTING OR PROGRAM

Not Applicable

INCORPORATION-BY-REFERENCE OF MATERIAL SUBMITTED ON A CD

Not Applicable

BACKGROUND OF THE INVENTION

1. Field of Invention

The present invention relates to the measurement of scattering parameters for microwave and radio-frequency (RF) devices-under-test (DUTs) under nonlinear operating conditions.

2. Description of the Related Art

It was shown in J. Verspecht, M. Vanden Bossche and Frans Verbeyst, "Characterizing Components Under Large Signal Excitation: Defining Sensible 'Large Signal S-Parameters'?!," 49th ARFTG Conference Digest, pp. 109–117, June 1997 that the nonlinear behaviour of a radio-frequency or microwave device-under-test with a periodic excitation signal at the input in a near matched environment can accurately be described by a 'Large-Signal S-parameter' model as defined in the above reference.

One practical method to measure the 'Large-Signal S-parameter' model for an actual DUT, restricted to fundamental frequency behaviour only, is described in Frans Verbeyst and Jan Verspecht, "Characterizing non-linear behavior," European Patent Application "EP 1 296 149 A1". With this method the 'Large-Signal S-parameter' model is identified by connecting to the output port of the DUT a matched load, an open, a short and a plurality of attenuators and delays and by each time measuring the fundamental spectral component of the incident and scattered voltage waves. The 'Large-Signal S-parameters' are then calculated by digitally processing the acquired data.

In Jon S. Martens, "Probe Tone S-parameter Measurements," United States patent application Publication, Pub. No.: "US 2002/0196033 A1", is described how 'Hot S22', which is one part of the complete 'Large-Signal S-parameter' model, can be measured by using a frequency-offset probe-tone method. With this probe-tone method a one-tone excitation signal is applied at the input signal port of the DUT (this is called the "power tone", its frequency is called the fundamental frequency), while a small one-tone signal with a frequency equal to the "power tone" frequency plus a small frequency offset is applied at the output signal port of the DUT (this signal is called the "probe tone"). 'Hot S22' is calculated by taking the ratio between the measured reflected voltage wave at the output signal port having a frequency equal to the fundamental frequency plus the said frequency offset and the measured incident scattered voltage wave at the output signal port having a frequency equal to the fundamental frequency plus the said frequency offset.

BRIEF SUMMARY OF THE INVENTION

In accordance with the present invention, a method and an apparatus are provided to determine the values of the parameters of a large-signal S-parameter model of a device-under-test by using a frequency-offset probe-tone method and by measuring and processing the spectral components of the scattered voltage waves with frequencies equal to the fundamental frequency, the fundamental frequency plus said frequency offset and the fundamental frequency minus said frequency offset. Said frequency offset can have a positive as well as a negative value. With said probe-tone method a one-tone excitation signal is applied at the input signal port of the DUT (this is called the "power tone", its frequency is called the fundamental frequency), while a small one-tone signal with a frequency equal to the "power tone" frequency plus a small frequency offset is applied at the output signal port of the DUT (this signal is called the "probe tone"). The small probe tone in the incident voltage wave at the output signal port of the device gives rise to spectral components in the reflected voltage waves at both DUT signal ports which are proportional to the real and imaginary parts of the complex value of the probe tone phasor. These spectral components appear at 2 frequencies: the fundamental frequency plus the said frequency offset and the fundamental frequency minus the said frequency offset. An apparatus measures the complex values of the phasors of the incident and the scattered voltage waves at the three frequencies of interest: the fundamental frequency, the fundamental frequency plus the said frequency offset and the fundamental frequency minus the said frequency offset. The 6 'Large-Signal S-parameters' are calculated using the measured complex values of the said phasor quantities. The 6 'Large-Signal S-parameters' include the 4 classic coefficients that are related to the spectral components of the incident voltage waves and 2 new coefficients that are related to the complex conjugate of the spectral components of the incident voltage waves.

DETAILED DESCRIPTION OF THE INVENTION

A. Test Method

Figure 1:
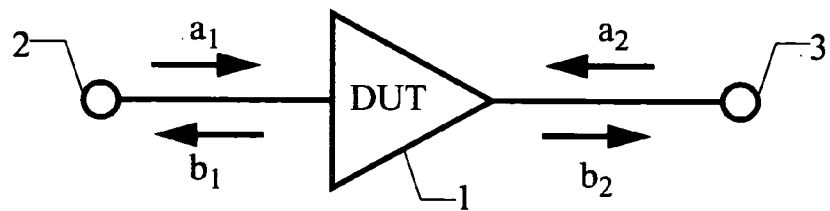
FIG. 1 shows the naming convention of the incident and the scattered voltage waves

FIG. 1 depicts a microwave or radio-frequency (RF) device-under-test (DUT) (1) having an input signal port (2) and an output signal port (3). The electromagnetic stimulus and response are described by 4 travelling voltage waves $a_1$, $a_2$, $b_1$ and $b_2$. The voltage waves are defined in a characteristic impedance which is typically 50 Ohm. Voltage wave $a_1$ is incident to the input signal port (2) of the DUT (1), voltage wave $a_2$ is incident to the output signal port (3) of the DUT (1), voltage wave $b_1$ is scattered by the input signal port (2) of the DUT (1) and voltage wave $b_2$ is scattered by the output signal port (3) of the DUT (1). The aforementioned voltage wave definitions are in standard use with a vector network analyzer (VNA). For a linear DUT the relationship between the stimulus ($a_1$, $a_2$) and the response ($b_1$, $b_2$) is described by an S-parameter matrix which can be measured with a standard VNA. When the DUT is an active device, like e.g. a power amplifier, the aforementioned S-parameter description can typically only be used if the input signals are small compared to the operating range of the device. Under large signal stimulus conditions (large compared to the specified operating range of the DUT) the superposition theorem will no longer be valid and S-parameters can no longer be used. So called "Large-Signal S-parameters" are used to describe DUT (1) behaviour under large signal operating conditions, as explained in William H. Leighton, Roger J. Chaffin and John G. Webb, "RF Amplifier Design with Large-Signal S-parameters," IEEE Transactions on Microwave Theory and Techniques, Vol. MTT-21, No. 12, December 1973. It is shown in Jan Verspecht, Marc Vanden Bossche and Frans Verbeyst, "Characterizing Components Under Large Signal Excitation: Defining Sensible 'Large Signal S-Parameters'?!," 49th ARFTG conference digest, June 1997 that a "Large-Signal S-parameter" description having 4 complex parameters ($S_{11}$, $S_{12}$, $S_{21}$, $S_{22}$), as it is used for a VNA and also in the aforementioned paper by W. H. Leighton et al., is incomplete and needs to be extended by adding two additional complex parameters, here called $S_{acc12}$ and $S_{acc22}$. These two additional parameters describe the relationship between the conjugate of the $a_2$ incident voltage wave and the $b_1$ and $b_2$ scattered voltage waves. $S_{acc12}$ and $S_{acc22}$ are exactly equal to zero under linear operating conditions and are as such not measured by a VNA. The object of the present invention is a novel method and test setup to measure the 6 "Large Signal S-parameters" ($S_{11}$, $S_{12}$, $S_{21}$, $S_{22}$, $S_{acc12}$, $S_{acc22}$). Consider a one-tone excitation $a_1$ with frequency $f_c$ at the input signal port (2), with a large amplitude, and a one-tone excitation $a_2$ having the same frequency $f_c$ at the output signal port (3), with a relatively small amplitude. The signal $a_2$ at the output port (3) should be small enough to ensure a linear response of the DUT (1) versus $a_2$. Under such operating conditions, as can be derived from the aforementioned paper by Jan Verspecht et al., the relationship between the response ($b_1$, $b_2$) and the stimulus ($a_1$, $a_2$) is given by:

$$b_1(f_c) = S_{11}(|a_1(f_c)|)a_1(f_c) + S_{12}(|a_1(f_c)|)a_2(f_c) + S_{acc12}(|a_1(f_c)|)p^2 a_2^*(f_c) \quad (1)$$

$$b_2(f_c) = S_{21}(|a_1(f_c)|)a_1(f_c) + S_{22}(|a_1(f_c)|)a_2(f_c) + S_{acc22}(|a_1(f_c)|)p^2 a_2^*(f_c) \quad (2),$$

where $$p = e^{j\phi(a_1(f_c))},$$

$\phi(x)$ represents the phase of complex phasor x, $|x|$ represents the amplitude of complex phasor x and $x^*$ stands for the conjugate of phasor x.

$S_{11}$, $S_{12}$, $S_{acc12}$, $S_{21}$, $S_{22}$ and $S_{acc22}$ are the 6 "Large Signal S-parameters". They are a function of the amplitude of the large signal component $a_1(f_c)$. The b-waves in equations (1) and (2) are a linear function of both $a_2$ and its conjugate $a_2^*$. For that reason the relationship between the b-waves and $a_2$ is called a non-analytic linear relationship. Note that a classic 4 S-parameter model does not contain the conjugate $a_2^*$ and is as such described by a regular (analytic) linear relationship.

A method to measure the "Large-Signal S-parameters" $S_{22}$ and $S_{acc22}$ is described in Frans Verbeyst and Jan Verspecht, "Characterizing non-linear behavior," European Patent Application 'EP 1 296 149 A1'. With the said method the said "Large-Signal S-parameters" $S_{22}$ and $S_{acc22}$ are measured by connecting to the output signal port (3) of the DUT (1) a matched load, an open, a short and a plurality of attenuators and delays and by each time measuring the fundamental spectral component of the incident and scattered voltage waves. The "Large-Signal S-parameters" $S_{22}$ and $S_{acc22}$ are then calculated by digitally processing the acquired data. In contrast to the present invention, the aforementioned method described in the said European patent application by Frans Verbeyst et al. requires many manipulations which are hard to automate and only determines three "Large-Signal S-parameters", namely $S_{21}$, $S_{22}$ and $S_{acc22}$.

Figure 2:
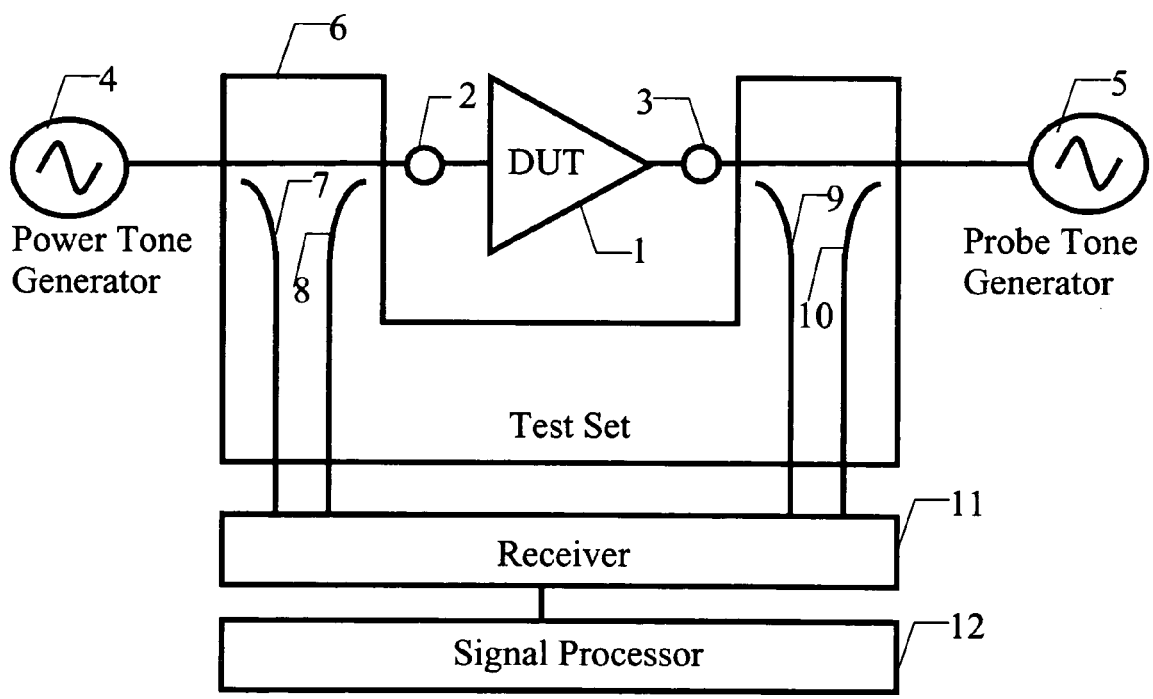
FIG. 2 shows a schematic test setup in accordance with the present invention
Figure 3:
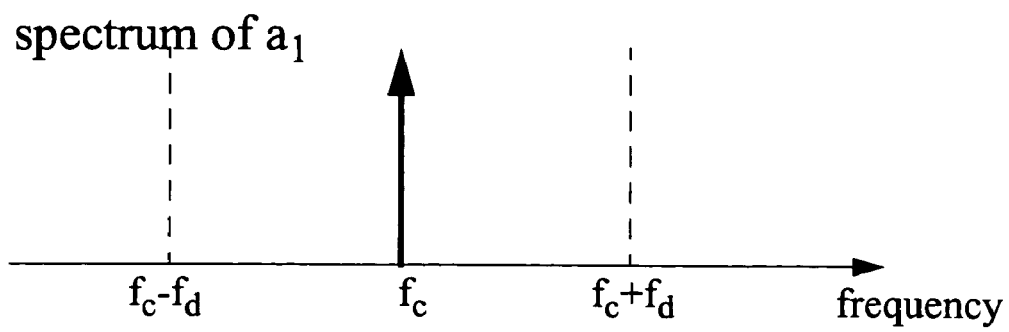
FIG. 3 shows a typical spectrum of the $a_1$ voltage wave during the operation of the test setup
Figure 4:
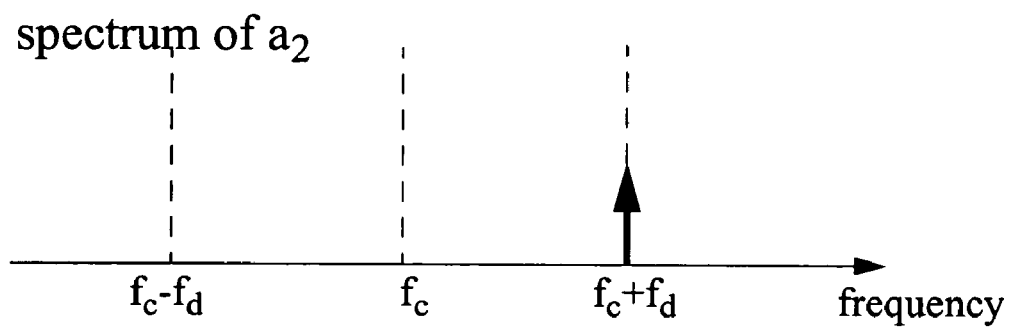
FIG. 4 shows a typical spectrum of the $a_2$ voltage wave during the operation of the test setup
Figure 5:
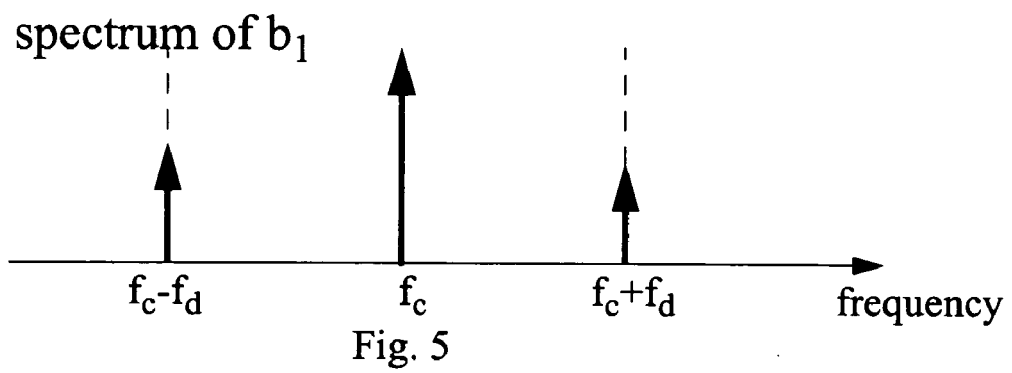
FIG. 5 shows a typical spectrum of the $b_1$ voltage wave during the operation of the test setup

The test setup of the present invention is illustrated in FIG. 2. A signal generator (4), called the "Power Tone Generator" is used to generate the necessary one-tone $a_1$ signal. In contrast with the description in the aforementioned European patent application by Frans Verbeyst et al. one will not with the present invention apply different loads to the output signal port (3) of the DUT (1). Instead one will use a signal generator (5), called the "Probe Tone Generator", for the generation of an $a_2$ one-tone signal with a frequency slightly offset from $f_c$ and equal to $f_c + f_d$. In order for the method to be accurate the frequency difference $f_d$, called the offset frequency, should be that small that the S-parameters do not vary across a frequency difference of $f_d$. The frequency difference $f_d$ can have a positive as well as a negative value. In practice one typically uses an offset frequency of several kHz. Since $f_c$ is a microwave or RF frequency it is typically much higher than 100 MHz, such that the S-parameters do not significantly change for a kHz frequency change. This method is known as an "offset frequency probe tone" method and is described in J. Martens, "Probe Tone S-parameter Measurements," United States patent application Publication, Pub. No. US 2002/0196033 A1, Dec. 26 2002. The resulting spectra of the voltage waves $a_1$, $a_2$, $b_1$ and $b_2$ during one "offset frequency probe tone" experiment are illustrated in FIG. 3, FIG. 4, FIG. 5 and FIG. 6. For $a_1$ (FIG. 3) there is only one spectral component present with a frequency $f_c$ and for $a_2$ (FIG. 4) there is only one spectral component present with a frequency $f_c + f_d$. For $b_1$ (FIG. 5) and $b_2$ (FIG. 6) there are spectral components present with frequencies $f_c - f_d$, $f_c$ and $f_c + f_d$. Only the presence of the spectral components with frequencies $f_c$ and $f_c+f_d$ is recognized and used in prior art. The existence of $b_1$ and $b_2$ spectral components with a frequency $f_c-f_d$ is not recognized nor used in prior art, in contradiction with the present invention.

In the aforementioned patent application publication by J. Martens, the "offset frequency probe tone" method is used for the determination of "Hot $S_{22}$" only. "Hot $S_{22}$" corresponds to the "Large-Signal S-parameter" $S_{22}$. The value of "Hot $S_{22}$" is found by sensing and measuring the voltage waves $b_2(f_c+f_d)$ and $a_2(f_c+f_d)$ and by calculating the ratio of the two measured quantities:

$$S_{22}=b_2(f_c+f_d)/a_2(f_c+f_d) \tag{3}$$

It is not uncommon to measure the values $a_1(f_c)$, $b_1(f_c)$ and $b_2(f_c)$ with a similar setup in order to calculate the "Large-Signal S-parameters" $S_{11}$ and $S_{21}$ as illustrated in "Measurement of Large Signal Input Impedance During Load Pull," Maury Microwave Corporation Application Note 5C-029, November 1998. The presence of the probe tone signal $a_2(f_c+f_d)$ is not necessary for the measurement of $S_{11}$ and $S_{21}$, which are calculated by using the following equations:

$$S_{11}=b_1(f_c)/a_1(f_c) \tag{4}$$

and $$S_{21}=b_2(f_c)/a_1(f_c) \tag{5}$$

With the present invention one will use an "offset frequency probe tone" method and one will not only measure the components $a_1(f_c)$, $a_2(f_c+f_d)$, $b_1(f_c)$, $b_1(f_c+f_d)$, $b_2(f_c)$ and $b_2(f_c+f_d)$, as is done in the described prior art, but one will include the measurement of the components $b_1(f_c-f_d)$ and $b_2(f_c-f_d)$. The mere existence of these frequency components is not recognized nor used in prior art. With the present invention one will measure the values of $a_1(f_c)$, $a_2(f_c+f_d)$, $b_1(f_c-f_d)$, $b_1(f_c)$, $b_1(f_c+f_d)$, $b_2(f_c-f_d)$, $b_2(f_c)$ and $b_2(f_c+f_d)$ and one will calculate the values of the "Large-Signal S-parameters" $S_{22}$, $S_{11}$ and $S_{21}$ as described in (3), (4) and (5). As will be explained in the following, the values of the "Large-Signal S-parameters" $S_{12}$, $S_{acc12}$ and $S_{acc22}$ are given by:

$$S_{12}=b_1(f_c+f_d)/a_2(f_c+f_d) \tag{6}$$

$$S_{acc12}=b_1(f_c-f_d)/(p^2 a_2^*(f_c+f_d)) \tag{7}$$

$$S_{acc22}=b_2(f_c-f_d)/(p^2 a_2^*(f_c+f_d)) \tag{8}$$

where $$p=e^{j\phi(a_1(f_c))}.$$

The above results can be derived as follows.

First one rewrites equations (1) and (2) using a complex envelope representation for the signals $a_1$, $a_2$, $b_1$ and $b_2$ (using $f_c$ as the carrier frequency). Complex envelope representations are mixed time frequency domain representations of signals and are explained in equation (1) of the detailed description of the invention described in U.S. Pat. No. 5,588,142 "Method for simulating a circuit". In short, $X(t)$ is the complex envelope representation (with carrier frequency $f_c$) of a signal $x(t)$ if the following holds.

$$x(t)=\text{Real}(X(t)e^{j2\pi f_c t}) \tag{9}$$

This results in the following equations.

$$B_1(t)=S_{11}A_1(t)+S_{12}A_2(t)+S_{acc12}A_2^*(t)P^2(t) \tag{10}$$

$$B_2(t)=S_{21}A_1(t)+S_{22}A_2(t)+S_{acc22}A_2^*(t)P^2(t) \tag{11}$$

where $$P(t)=e^{j\phi(A_1(t))}.$$

During a "frequency offset probe tone" measurements $A_1(t)$ and $A_2(t)$ are given by the following equations.

$$A_1(t)=K \tag{12}$$

$$A_2(t)=Le^{j2\pi f_d t} \tag{13}$$

In the above equations K and L are 2 complex constants having a real and an imaginary part.

Substituting (12) and (13) in (10) and (11) results in the following equations.

$$B_1(t)=S_{11}K+S_{12}Le^{j2\pi f_d t}+S_{acc12}L^*e^{j2\phi(K)}e^{-j2\pi f_d t} \tag{14}$$

$$B_2(t)=S_{21}K+S_{22}Le^{j2\pi f_d t}+S_{acc12}L^*e^{j2\phi(K)}e^{-j2\pi f_d t} \tag{15}$$

Next equations (14) and (15) are converted into the frequency domain by applying a Fourier transform. The function $\delta(f)$ will be introduced. It is defined as being equal to 0 for all f different from 0 and with $\delta(0)$ equal to 1. This results in the following.

$$b_1(f)=S_{11}K\delta(f-f_c)+S_{12}L\delta(f-f_c-f_d)+S_{acc12}L^*e^{j2\phi(K)}\delta(f-f_c+f_d) \tag{16}$$

$$b_2(f)=S_{12}K\delta(f-f_c)+S_{22}L\delta(f-f_c-f_d)+S_{acc22}L^*e^{j2\phi(K)}\delta(f-f_c+f_d) \tag{17}$$

For the described "frequency offset probe tone" method K and L are given by the following.

$$K=a_1(f_c) \tag{18}$$

$$L=a_2(f_c+f_d) \tag{19}$$

Substitution of (18) and (19) in (16) and (17) results in the following.

$$b_1(f)=S_{11}a_1(f_c)\delta(f-f_c)+S_{12}a_2(f_c+f_d)\delta(f-f_c-f_d)+S_{acc12}a_2^*(f_c+f_d)p^2\delta(f-f_c+f_d) \tag{20}$$

$$b_2(f)=S_{21}a_1(f_c)\delta(f-f_c)+S_{22}a_2(f_c+f_d)\delta(f-f_c-f_d)+S_{acc22}a_2^*(f_c+f_d)p^2\delta(f-f_c+f_d) \tag{21}$$

Subsequent substitution of f by $f_c$, $f_c+f_d$ and $f_c-f_d$ leads to the results described in equations (3), (4), (5), (6), (7) and (8).

B. Test Setup

A typical test setup which implements the aforementioned method in practice is described in FIG. 2. A test set (6) is connected to the input signal port (2) of the DUT (1), the output signal port (3) of the DUT (1), a "Power Tone Generator" (4), a "Probe Tone Generator" (5) and a microwave and RF receiver (11). The $a_1$ signal generated by the "Power Tone Generator" (4) is guided by the test set (6) to the input signal port (2) of the DUT (1) and the $a_2$ signal generated by the "Probe Tone Generator" (5) is guided by the test set (6) to the output signal port (3) of the DUT (1). The test set senses the voltage waves $a_1$, $a_2$, $b_1$ and $b_2$ and guides the sensed voltage waves to a microwave and RF receiver (11). Four couplers (7), (8), (9) and (10) are typically used for sensing the voltage waves. Other possibilities for sensing the voltage waves are electrical and magnetic field probes and resistive bridges.

The output of the receiver (11) are the measured values of $a_1(f_c)$, $a_2(f_c+f_d)$, $b_1(f_c-f_d)$, $b_1(f_c)$, $b_1(f_c+f_d)$, $b_2(f_c-f_d)$, $b_2(f_c)$ and $b_2(f_c+f_d)$. These values are transfered to a signal processor (12) for calibration purposes and for the calculation of the 6 "Large-Signal S-parameters" $S_{11}$, $S_{12}$, $S_{acc12}$, $S_{21}$, $S_{22}$ and $S_{acc22}$ according to equations (3), (4), (5), (6), (7) and (8).

In a typical experiment the amplitude of $a_1(f_c)$ and the frequency $f_c$ are swept across a range specified by the user.

In a practical test setup $a_1(f_c-f_d)$, $a_1(f_c+f_d)$, $a_2(f_c-f_d)$ and $a_2(f_c)$ may be slightly different from zero due to parasitical reflections in the test set. In that case the use of equations (3), (4), (5), (6), (7) and (8) will result in a small error. This error can be corrected by using calibration techniques which make use of calculations based upon the 6 measured quantities $a_1(f_c)$, $a_2(f_c+f_d)$, $a_1(f_c-f_d)$, $a_1(f_c+f_d)$, $a_2(f_c-f_d)$ and $a_2(f_c)$.

To those skilled in the art it is clear that the presented novel method and test setup can easily be extended to the measurement of "Large-Signal S-parameters" for DUTs having more than two signal ports.

C. Simulation

Figure 6:
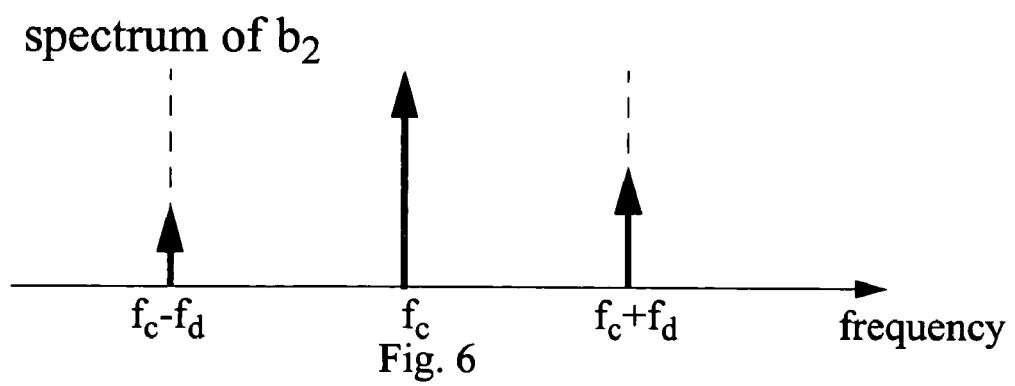
FIG. 6 shows a typical spectrum of the $b_2$ voltage wave during the operation of the test setup
Figure 7:
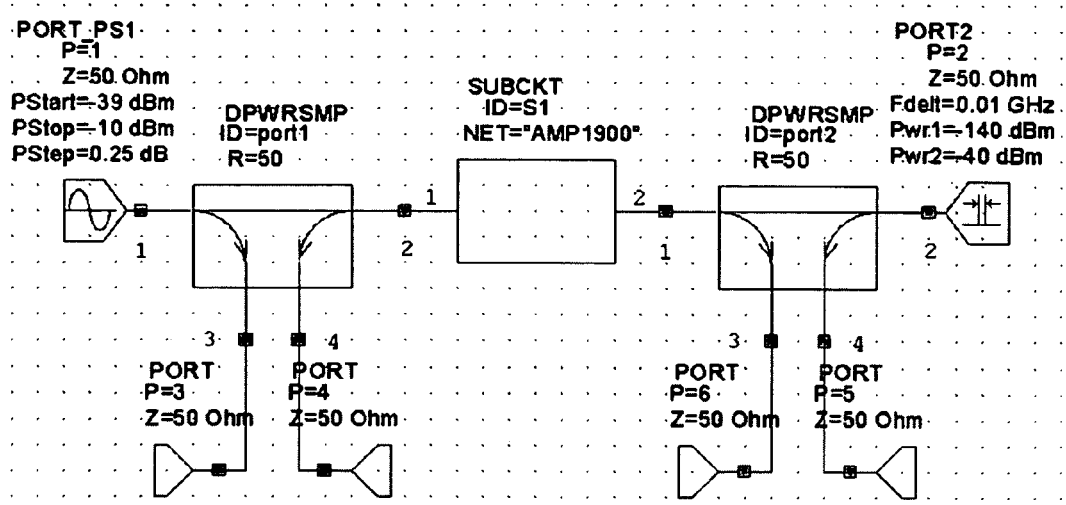
FIG. 7 shows an implementation of the invention in an harmonic balance simulator
Figure 8:
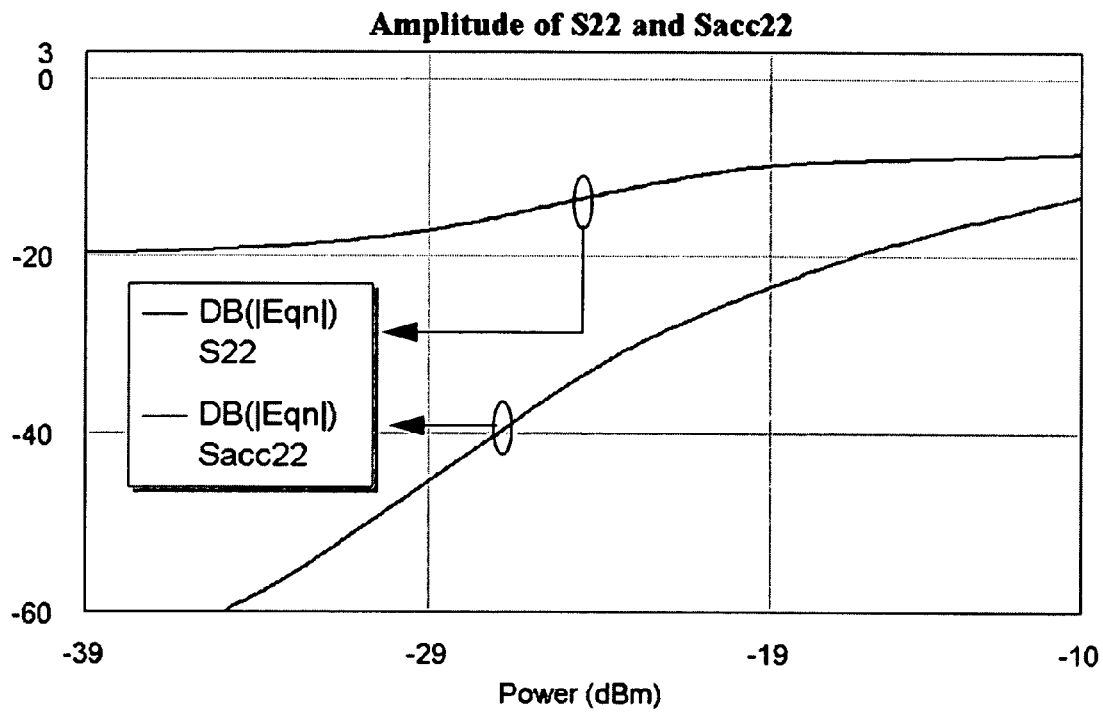
FIG. 8 shows the simulated amplitude of $S_{22}$ and $S_{acc22}$ as a function of the amplitude of $a_1$
Figure 9:
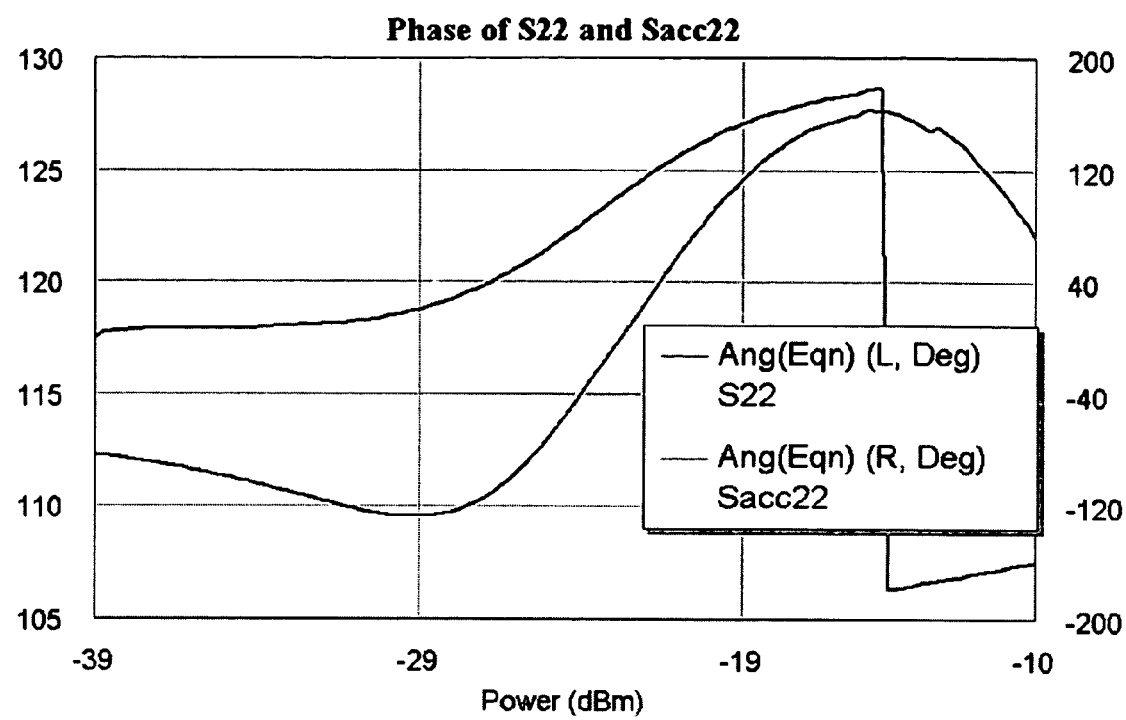
FIG. 9 shows the simulated phase of $S_{22}$ and $S_{acc22}$ as a function of the amplitude of $a_1$

The present invention for determining the 6 "Large-Signal S-parameters" of a DUT (1) can also be used in circuit and system simulators. The described "Large-Signal S-parameter" model can be used as a fast and accurate black-box behavioral model which can easily be derived from complex transistor circuits by simulating the test setup as described above. An example of the implementation of the present invention in a commercial harmonic balance simulator is shown in FIG. 6. FIG. 7 shows the simulated amplitude of $S_{22}$ and $S_{acc22}$ for a swept $a_1(f_c)$ amplitude. FIG. 8 shows the simulated phase of $S_{22}$ and $S_{acc22}$ for the same swept $a_1(f_c)$ amplitude. Note that the amplitude of $S_{acc22}$ tends to zero for a small amplitude of $a_1(f_c)$. This is what one expects since the linear small-signal S-parameter model is valid under those conditions, which implies a non-existent or in other words zero-valued $S_{acc22}$.

What is claimed is:

1. A method for characterizing a device under test (DUT) comprising the steps of:

providing a first sinusoidal signal having a first frequency to a first signal port of said DUT as a power tone signal;

providing a second signal having a second frequency to a second signal port of said DUT as a probe tone signal, whereby the difference between said second frequency and said first frequency is equal to a third frequency and whereby the amplitude of said second signal is such that there exists a non-analytic substantially linear relationship between the spectral components of the traveling voltage waves that are incident to said DUT signal ports and that have said second frequency and the spectral components of the traveling voltage waves that are scattered by said DUT signal ports and that have a frequency equal to said first frequency minus said third frequency; and determining the spectral components of the traveling voltage waves that are incident to said DUT signal ports and the spectral components of the traveling voltage waves that are scattered by said DUT signal ports, whereby said spectral components are determined for a frequency equal to said first frequency, equal to said second frequency and equal to said first frequency minus said third frequency.

2. The method of claim 1, further including the step of using said spectral components for calculating "large-signal S-parameters" of said DUT, whereby said "large-signal S-parameters" include coefficients that relate scattered voltage waves with a complex conjugate of a voltage wave that is incident on said second signal port of said DUT.

3. The method of claim 2, whereby said first signal and said second signal are provided to said DUT in a circuit simulator and whereby said determination of said spectral components is provided by performing a circuit simulation.

* * * * *